US008849148B2

(12) United States Patent
Nishiyama

(10) Patent No.: US 8,849,148 B2
(45) Date of Patent: Sep. 30, 2014

(54) ELECTRONIC APPARATUS HAVING PIVOTABLE SUPPORT MEMBER FOR SUPPORTING ELECTRIC CIRCUIT BOARD

(75) Inventor: Takeshi Nishiyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 64 days.

(21) Appl. No.: 13/539,819

(22) Filed: Jul. 2, 2012

(65) Prior Publication Data

US 2013/0016991 A1 Jan. 17, 2013

(30) Foreign Application Priority Data

Jul. 15, 2011 (JP) ................................ 2011-156332

(51) Int. Cl.
*G03G 15/00* (2006.01)
*H05K 7/16* (2006.01)
*G03G 21/16* (2006.01)

(52) U.S. Cl.
CPC ............ *G03G 15/80* (2013.01); *G03G 21/1623* (2013.01); *G03G 2215/0132* (2013.01)
USPC ............... 399/90; 399/81; 399/107; 399/110; 361/725; 312/223.1

(58) Field of Classification Search
USPC ......... 399/81, 90, 107, 110; 361/679.36, 725; 312/223.1, 265.1
See application file for complete search history.

(56) References Cited

U.S. PATENT DOCUMENTS 6,795,662 B2 * 9/2004 Kudo .............................. 399/81
6,822,878 B2 * 11/2004 Dobbs et al. .................. 361/807
7,822,359 B2 * 10/2010 Kawahara et al. ............ 399/107
8,493,631 B2 * 7/2013 Takata et al. .................. 358/401
2006/0077486 A1 * 4/2006 Lizarraga et al. ............. 358/498
2006/0182476 A1 * 8/2006 Imada et al. .................. 399/377

FOREIGN PATENT DOCUMENTS

JP 61-44653 U 3/1986
JP 2001-334725 A 12/2001
JP 2005-215199 A 8/2005
JP 2005215199 A * 8/2005
JP 2006-242971 A 9/2006
SE 9401491 A * 11/1995

* cited by examiner

*Primary Examiner* — David Gray
*Assistant Examiner* — Francis Gray
(74) *Attorney, Agent, or Firm* — Birch, Stewart, Kolasch & Birch, LLP

(57) ABSTRACT

An electronic apparatus includes a functional unit, an electric circuit board, a pivotable support member, an outer cover, and wiring. The functional unit is disposed inside the electronic apparatus. The electric circuit board is configured to control the functional unit. The pivotable support member is shaped rectangular having a vertical length that is shorter than a horizontal length thereof and is pivotally movable about a pivoting axis defined to extend along one horizontally extending side of the pivotable support member between a closed position in which the pivotable support member covers the functional unit and an open position in which the functional unit is exposed. The outer cover is disposed more outwardly than the pivotable support member. The wiring passes through a pivoting axis side of the pivotable support member to connect the functional unit to the electric circuit board.

6 Claims, 11 Drawing Sheets

ELECTRONIC APPARATUS HAVING PIVOTABLE SUPPORT MEMBER FOR SUPPORTING ELECTRIC CIRCUIT BOARD

CROSS REFERENCE

This Nonprovisional application claims priority under 35 U.S.C. §119(a) on Patent Application No. 2011-156332 filed in Japan on Jul. 15, 2011, the entire contents of which are hereby incorporated by reference.

BACKGROUND OF THE INVENTION

The present invention relates to an electronic apparatus provided with a pivotable support member supporting an electric circuit board.

Among typical electronic apparatuses, a copier, for example, has been requested to reduce its installation space by downsizing of the apparatus body in spite of a continuous steep increase in the number of required electric components including an electric circuit board for electrically controlling the apparatus body with colorization and speeding up. It has been a conventional practice to accommodate such a steep increase in the number of required electric components by collectively disposing such electric components on the rear side of the apparatus body together with electric circuit boards and the like superposed on one another, thereby to meet the space saving request.

For example, a color image forming apparatus of the tandem type has a rear side on which driving means for driving a photoreceptor drum of each image forming unit and other devices, driving means for bringing each photoreceptor drum and an intermediate transfer belt into contact with each other and separating them from each other and driving means for driving a sheet feeding mechanism are placed side by side.

In order to make the outside dimensions of the image forming apparatus compact, electric circuit boards are disposed as stacked on one another, the electric circuit boards including: a low-voltage power board for supplying an electric power to the image forming apparatus; a high-voltage power board for supplying a voltage of several hundred to several thousand volts to be applied for developing a toner image on each photoreceptor drum, for transferring such a toner image from each photoreceptor drum to the intermediate transfer belt, for transferring a toner image from the intermediate transfer belt to a recording sheet, and for a like operation; an I/O board for controlling inputs and outputs of various signals; a control board for performing image information processing; and a like electric circuit board.

In performing maintenance on the image forming apparatus or a like operation, such electric circuit boards have to be removed from the apparatus body sequentially from the control board located at the outermost place on the rear side. This makes the maintenance operation troublesome.

In attempt to eliminate such an inconvenience, an image forming apparatus which allows easy maintenance to be performed thereon has been disclosed including a functional unit, such as a driving unit, on an outer surface of the housing of the image forming apparatus, an openable board support member mounted on the image forming apparatus so as to cover the functional unit, and electric circuit boards accommodated in the board support member (see Japanese Patent Laid-Open Publication No. 2005-215199 for example). With this image forming apparatus, the board support member is opened to expose the functional unit, thereby facilitating the maintenance.

In the patent laid-open publication noted above, wiring comprising wires or harnesses which connects the electric circuit boards to the functional unit of the apparatus body is routed casually.

For this reason, in cases where connector terminals and the like of an electric circuit board accommodated in the board support member are located clear of the pivoting axis of the board support member, the wiring has to be routed by being drawn out of the apparatus body by an extra length in addition to the distance from a predetermined functional unit to an associated connector terminal provided on the electric circuit board in order to make connection to the associated connector terminal. The extra length is a length that is necessary for the board support member to pivot into its open position. Therefore, the total length of the wiring has to be longer than necessary, which is not reasonable.

The board support member according to Japanese Patent Laid-Open Publication No. 2005-215199 is shaped rectangular having a horizontal length that is longer than a vertical length thereof and is mounted on the apparatus body by a pivot shaft or a hinge for pivotal movement about a pivoting axis extending in the vertical direction so as to be open and closed relative to the apparatus body.

For this reason, a considerably large space is necessary for the board support member to move pivotally to reach its open position. Usually, substantially no space is provided on the rear side of the apparatus body. Therefore, the amount of opening of the openable support member is relatively small on the side near the pivoting axis. For this reason, the openable support member accommodating the electric circuit boards therein has to be removed from the apparatus body in removing and mounting the functional unit during maintenance.

A feature of the present invention is to provide an electronic apparatus which allows the length of wiring to be shortened while enabling the operability to be improved in performing maintenance on the apparatus body.

SUMMARY OF THE INVENTION

An electronic apparatus according to the present invention includes a functional unit, an electric circuit board, a pivotable support member, an outer cover, and wiring.

The functional unit is disposed inside the electronic apparatus and has a driving portion. The electric circuit board is configured to control the functional unit. The pivotable support member is disposed more outwardly than the functional unit to support the electric circuit board. The pivotable support member is shaped rectangular having a vertical length that is shorter than a horizontal length thereof and is pivotally movable about a pivoting axis defined to extend along one horizontally extending side of the pivotable support member between a closed position in which the pivotable support member covers the functional unit and an open position in which the functional unit is exposed. The outer cover is disposed more outwardly than the pivotable support member. The wiring passes through a pivoting axis side of the pivotable support member to connect the functional unit to the electric circuit board.

With this arrangement, the wiring passes through the pivoting axis side of the pivotable support member to connect the functional unit to the electric circuit board and, hence, the wiring fails to become tense even when the pivotable support member pivots from the closed position to the open position. Therefore, there is no need to draw out the wiring by an extra length in routing the wiring, which enables the total length of the wiring to be shortened.

Further, the pivotable support member is shaped rectangular having the vertical length that is shorter than the horizontal length thereof and is pivotable about the pivoting axis defined to extend along one horizontally extending side of the pivotable support member and, hence, a relatively small space will suffice for the pivotable support member to move pivotally from the closed position to the open position. Therefore, the pivotable support member can fully pivot to reach the open position during maintenance on the electronic apparatus, thereby enabling the operability to be improved in performing maintenance on the electronic apparatus.

DETAILED DESCRIPTION OF THE INVENTION

Hereinafter, an electronic apparatus embodying the present invention will be described in detail with reference to the attached drawings.

Initially, description is directed to a first embodiment of the present invention.

Figure 1:
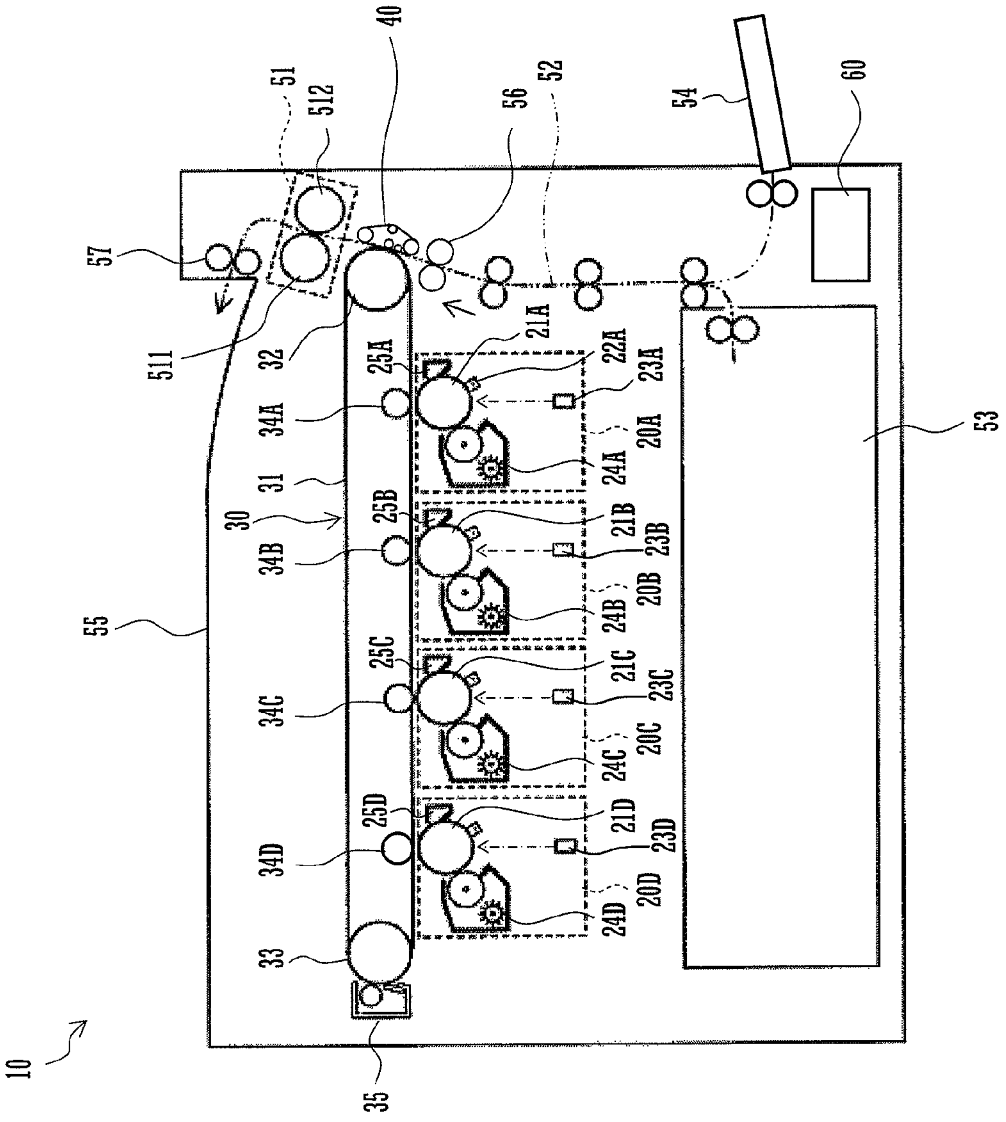
FIG. 1 is a front elevational view illustrating the configuration of an image forming apparatus according to a first embodiment of the present invention.

FIG. 1 is a front elevational view illustrating the configuration of an image forming apparatus 10 according to the first embodiment of the present invention.

The image forming apparatus 10 is described herein as an exemplary electronic apparatus. The image forming apparatus 10 includes a plurality of image forming units 20A to 20D, a primary transfer unit 30, a secondary transfer unit 40, a fixing device 51, a sheet feed path 52, a sheet feed cassette 53, a manual feed tray 54, a sheet output tray 55, and a control portion 60. The control portion 60 is configured to control different portions of the image forming apparatus 10 overall. The image forming units 20A to 20D will be generally referred to as "image forming unit 20" as the case may be.

The image forming apparatus 10 carries out an electrophotographic image forming process using image data items corresponding to four colors: black, cyan, magenta and yellow.

The following description is directed mainly to the image forming unit 20A. The other image forming units 20B to 20D are substantially similar in configuration to the image forming unit 20A. The image forming unit 20A, which is associated with black, includes a photoreceptor drum 21A, an electrostatic charger device 22A, an exposure device 23A, a developing device 24A, and a cleaning unit 25A and is configured to form a black toner image by the electrophotographic image forming process.

The photoreceptor drum 21A, as well as photoreceptor drums 21B to 21D included in the respective image forming units 20B to 20D, is rotated in one direction by a driving force transmitted thereto from a non-illustrated a driving motor.

The electrostatic charger device 22A is disposed to face the peripheral surface of the photoreceptor drum 21A and configured to electrostatically charge the peripheral surface of the photoreceptor drum 21A to a predetermined potential. The exposure device 23A is configured to irradiate the peripheral surface of the photoreceptor drum 21A with a laser beam modulated according to a black image data item. The developing device 24A contains a black toner therein.

The primary transfer unit 30 includes a primary transfer belt 31, a primary transfer driving roller 32, a primary transfer idle roller 33, primary transfer rollers 34A to 34D, and a primary transfer belt cleaning unit 35.

The primary transfer belt 31 is entrained about the primary transfer driving roller 32 and the primary transfer idle roller 33 for revolution therearound in a predetermined direction. The primary transfer rollers 34A to 34D are opposed to the photoreceptor drums 21A to 21D, respectively, across the primary transfer belt 31. The regions in which the photoreceptor drums 21A to 21D are opposed to the outer peripheral surface of the primary transfer belt 31 are primary transfer regions.

The cleaning unit 25A is configured to recover residual toner remaining on the peripheral surface of the photoreceptor drum 21A after the primary transfer following the developing step. The secondary transfer unit 40 is opposed to the primary transfer driving roller 32 across the primary transfer belt 31 and is movable toward and away from the primary transfer driving roller 32. The region in which the primary transfer belt 31 and the secondary transfer unit 40 are pressed against each other is a secondary transfer region.

Each of the sheet feed cassette 53 and the manual feed tray 54 accommodates recording sheets therein. The sheet feed path 52 is designed to guide each of the recording sheets fed from the sheet feed cassette 53 or manual feed tray 54 to the sheet output tray 55 via the secondary transfer region and the fixing device 51.

Registration rollers 56 are disposed adjacent the upstream side of the secondary transfer region in the sheet feed direction. The orientation of each recording sheet fed from the sheet feed cassette 53 or manual feed tray 54 into the sheet feed path 52 is corrected by allowing the recording sheet to impinge upon the registration rollers 56 in a stationary state and then the recording sheet is fed into the secondary transfer region by the registration rollers 55 which start rotating with predetermined timing.

A toner image born on the primary transfer belt 31 is secondarily transferred onto the recording sheet by generating a predetermined secondary transfer electric field over the secondary transfer region. A primary transfer belt cleaning unit 35 recovers residue of the toner born on the primary transfer belt 31 that remains on the primary transfer belt 31 without having been transferred to the recording sheet. This prevents color mixture from occurring in the subsequent steps.

The fixing device 51 includes a heating roller 511 and a pressurizing roller 512. The heating roller 511 and the pressurizing roller 512 are pressed against each other. The fixing device 51 feeds each recording sheet while nipping it by a nip portion defined between the heating roller 511 and the pressurizing roller 512, thereby heating and pressurizing the recording sheet. By so doing, the toner image is firmly fixed to the recording sheet. The recording sheet bearing the toner image thus fixed thereto is outputted onto the sheet output tray 55 by a sheet output roller pair 57.

Figure 2:
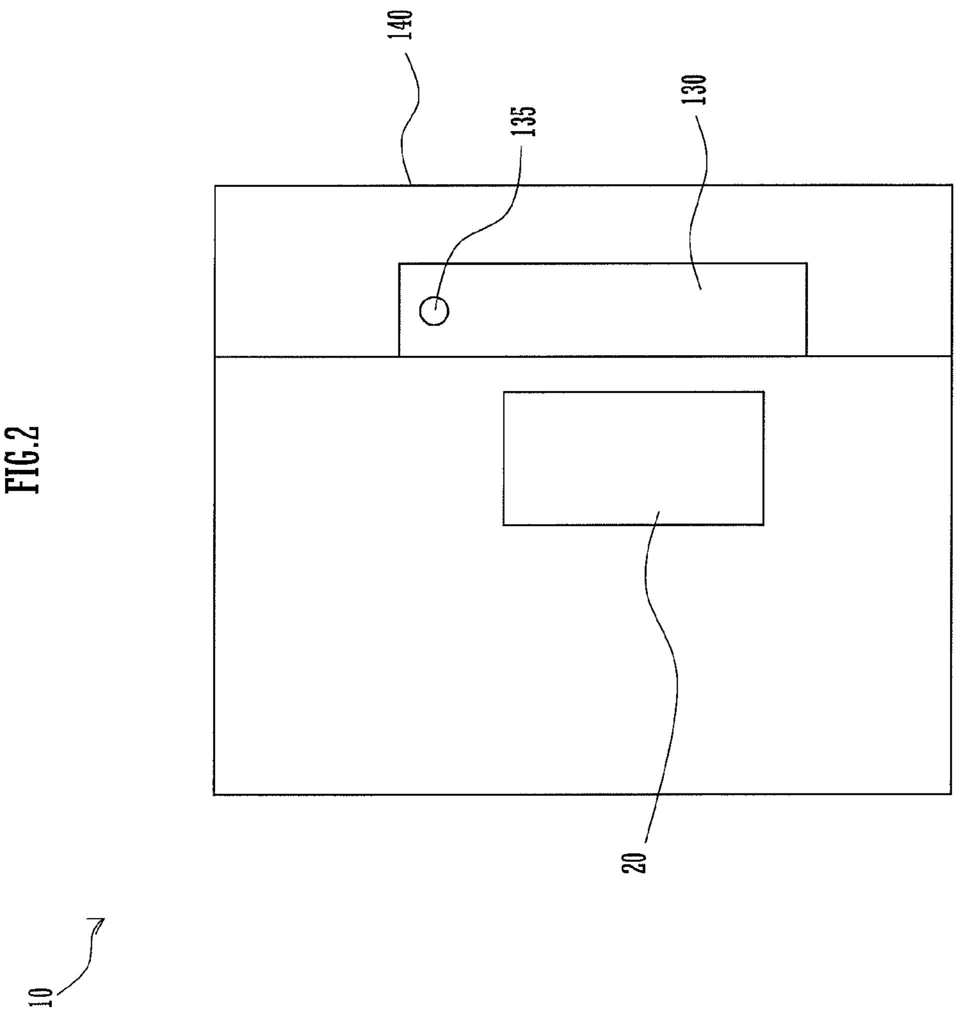
FIG. 2 is a right-hand side elevational view illustrating a relevant portion of the image forming apparatus according to the first embodiment of the present invention.
Figure 3:
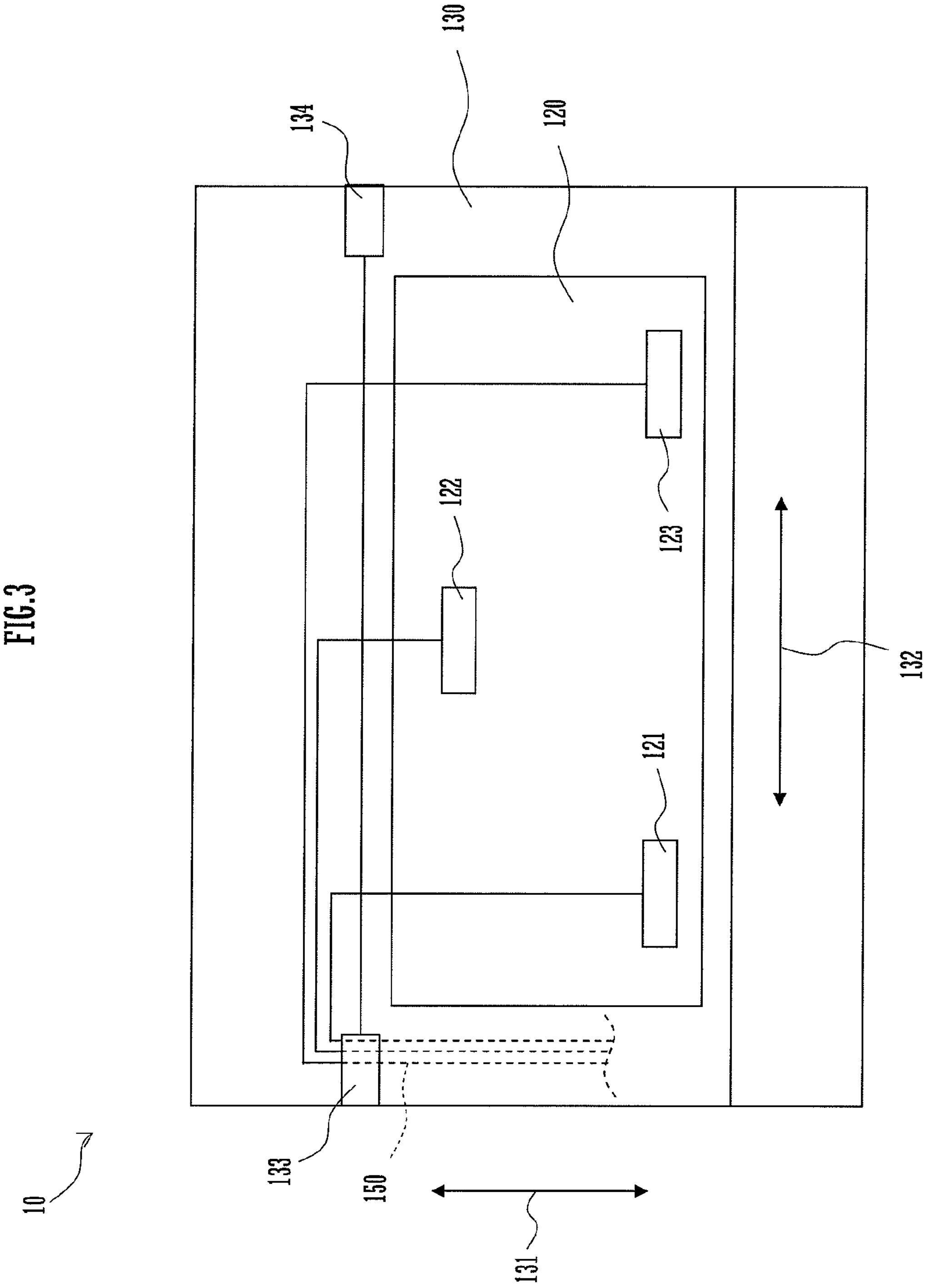
FIG. 3 is a rear elevational view illustrating a relevant portion of the image forming apparatus according to the first embodiment of the present invention.

FIG. 2 is a right-hand side elevational view illustrating a relevant portion of the image forming apparatus 10 according to the first embodiment of the present invention. FIG. 3 is a rear elevational view illustrating a relevant portion of the image forming apparatus 10 according to the first embodiment of the present invention.

The image forming apparatus 10 includes the image forming unit 20, an electric circuit board 120, a pivotable support member 130, an outer cover 140, and a harness 150. The image forming unit 20 is equivalent to the "functional unit" defined by the present invention. The harness 150 is equivalent to the "wiring" defined by the present invention. According to the present invention, functional units other than the image forming unit 20 include an electric power unit, a driver unit, a sheet feeding unit, a toner feeding unit, a driving unit, and a like unit.

The image forming unit 20 is disposed inside the image forming apparatus 10 and has a non-illustrated driving portion. The electric circuit board 120 is configured to control the image forming unit 20. The pivotable support member 130 is disposed more outwardly than the image forming unit 20 and supports the electric circuit board 120. The pivotable support member 130 is shaped rectangular having a vertical length 131 that is shorter than a horizontal length 132 thereof and is pivotally movable about a pivoting axis 135 defined to extend along one horizontally extending side of the pivotable support member 130 between a closed position in which the pivotable support member 130 covers the image forming unit 20 and an open position in which the image forming unit 20 is exposed.

In the present embodiment, the pivoting axis 135 is defined to extend along the upper edge of the pivotable support member 130 which forms one horizontally extending side of the pivotable support member 130 by providing hinges 133 and 134 on an upper edge portion of the pivotable support member 130. The length 131 is herein referred to as the "vertical length" because the length 131 is the vertical length of the pivotable support member 130 in the closed position.

The outer cover 140 is disposed more outwardly than the pivotable support member 130. The harness 150 passes through the pivoting axis 135 side of the pivotable support member 130 to connect the image forming unit 20 to the electric circuit board 120.

The harness 150 is connected to a connector 26 (see FIG. 5) of the image forming unit 120 and to individual connectors 121 to 123 of the electric circuit board 120. The harness 150 is routed along the pivoting axis 135 and then branched toward the individual connectors 121 to 123.

Figure 4:
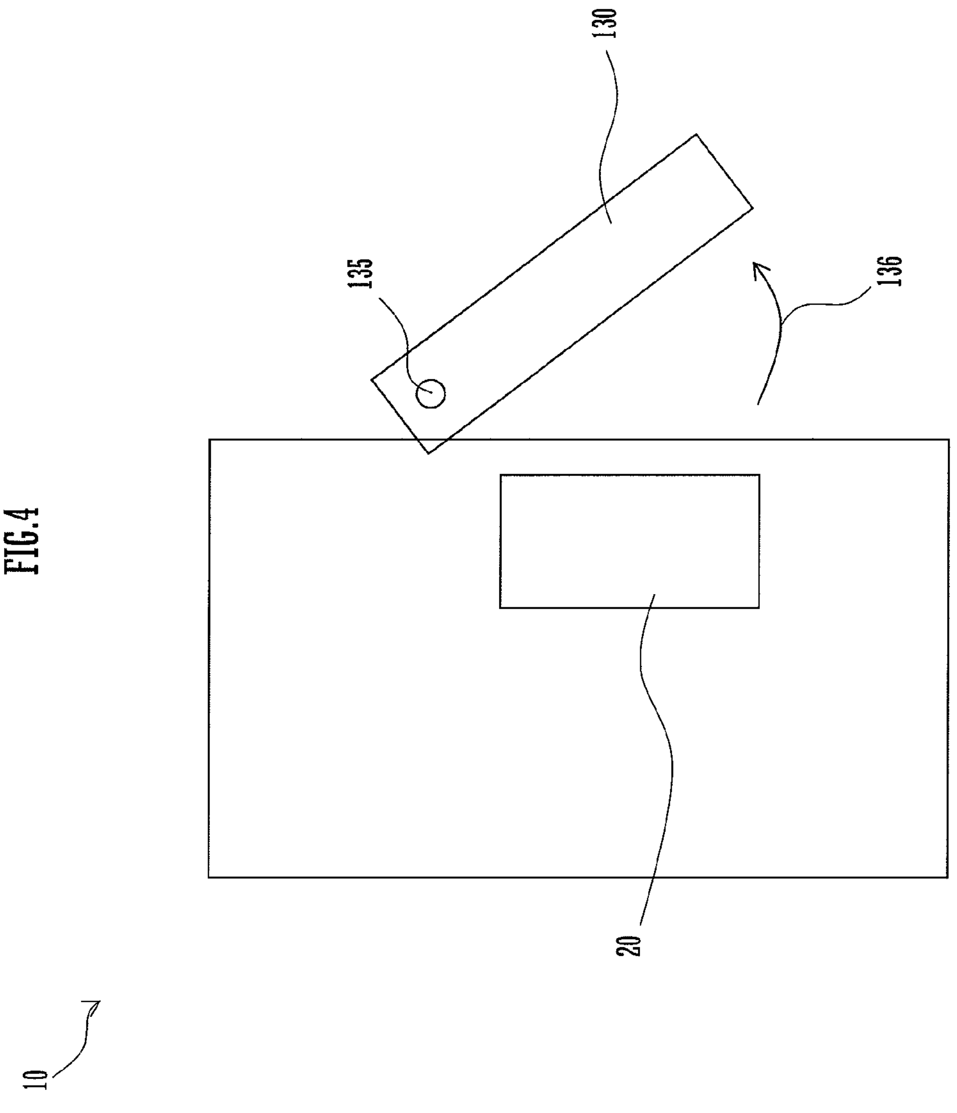
FIG. 4 is a right-hand side elevational view of the image forming apparatus for illustrating a pivoting direction of a pivotable support member.
Figure 5:
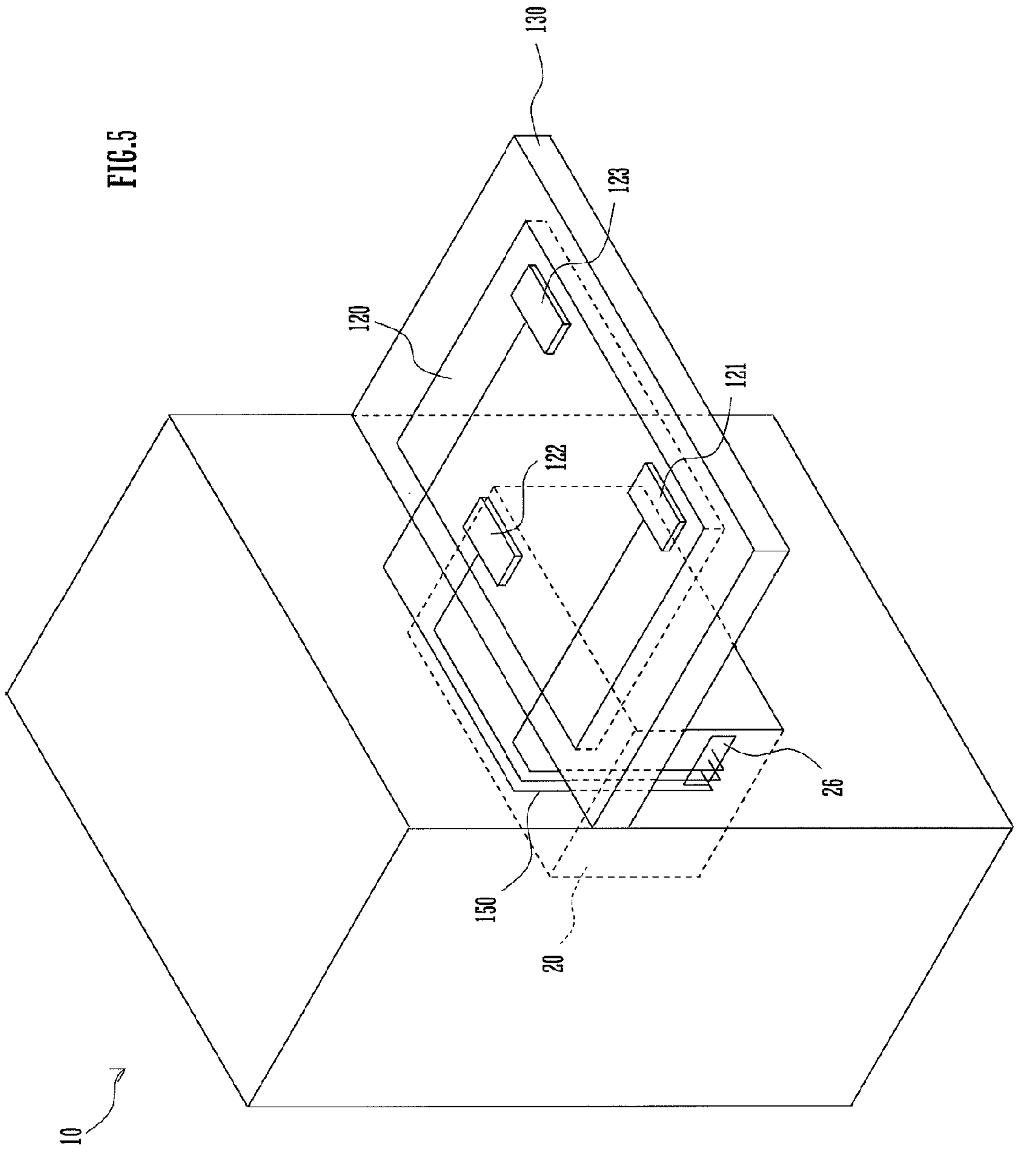
FIG. 5 is a perspective view of the image forming apparatus for illustrating a state in which the pivotable support member is in an open position.

In performing maintenance, the pivotable support member 130 can pivot to reach the position shown in FIG. 5 (i.e., open position) by being caused to pivot about the pivoting axis 135 in the direction indicated by arrow 136 as shown in FIG. 4.

In this arrangement, the harness 150 passes through the pivoting axis 135 side of the pivotable support member 130 to connect the image forming unit 20 to the electric circuit board 120. Therefore, the harness 150 fails to become tense even when the pivotable support member 130 moves pivotally from the closed position to the open position. Therefore, there is no need to draw out the harness 150 by an extra length in routing the harness 150, which enables the total length of the harness 150 to be shortened.

Further, the pivotable support member 130 is shaped rectangular having the vertical length 131 that is shorter than the horizontal length 132 and is pivotally movable about the pivoting axis 135 defined to extend along one horizontally extending side of the pivotable support member 130. For this reason, a relatively small space will suffice for the pivotable support member 130 to pivot from the closed position to the open position. Therefore, the pivotable support member 130 can fully pivot to reach the open position during maintenance on the electronic apparatus 10, thereby enabling the operability to be improved in performing maintenance on the electronic apparatus 10.

Figure 6:
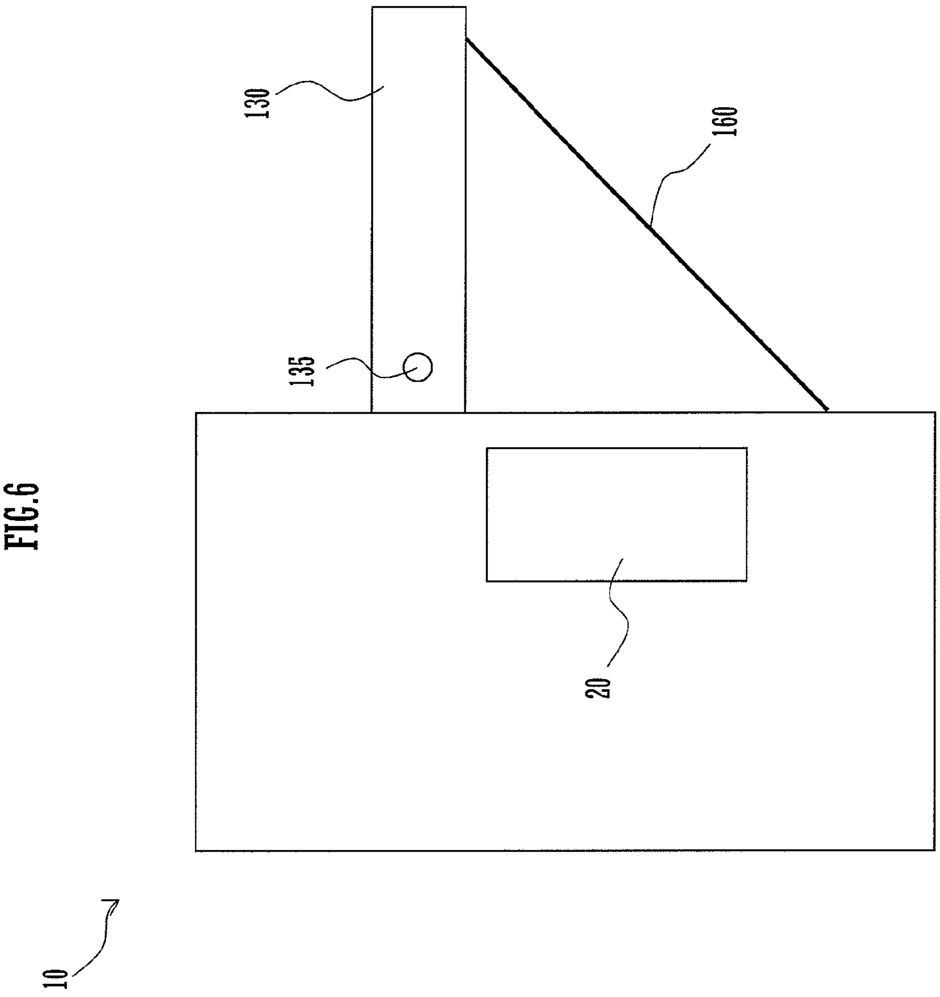
FIG. 6 is a right-hand side elevational view of the image forming apparatus for illustrating a stay retaining the pivotable support member in the open position.

Preferably, the image forming apparatus 10 further includes a stay 160 as shown in FIG. 6. The stay 160 is equivalent to the "first retaining member" defined by the present invention. The stay 160 retains the pivotable support member 130 in the open position.

With this feature, the pivotable support member 130 is reliably retained in the open position by the stay 160 after having been pivotally moved into the open position. This provides improved accessibility to the image forming unit 20 located more inwardly than the pivotable support member 130, thereby allowing maintenance to be performed safely.

The following description is directed to a second embodiment of the present invention. Redundant description of features common to the first and second embodiments will be omitted appropriately.

Figure 7:
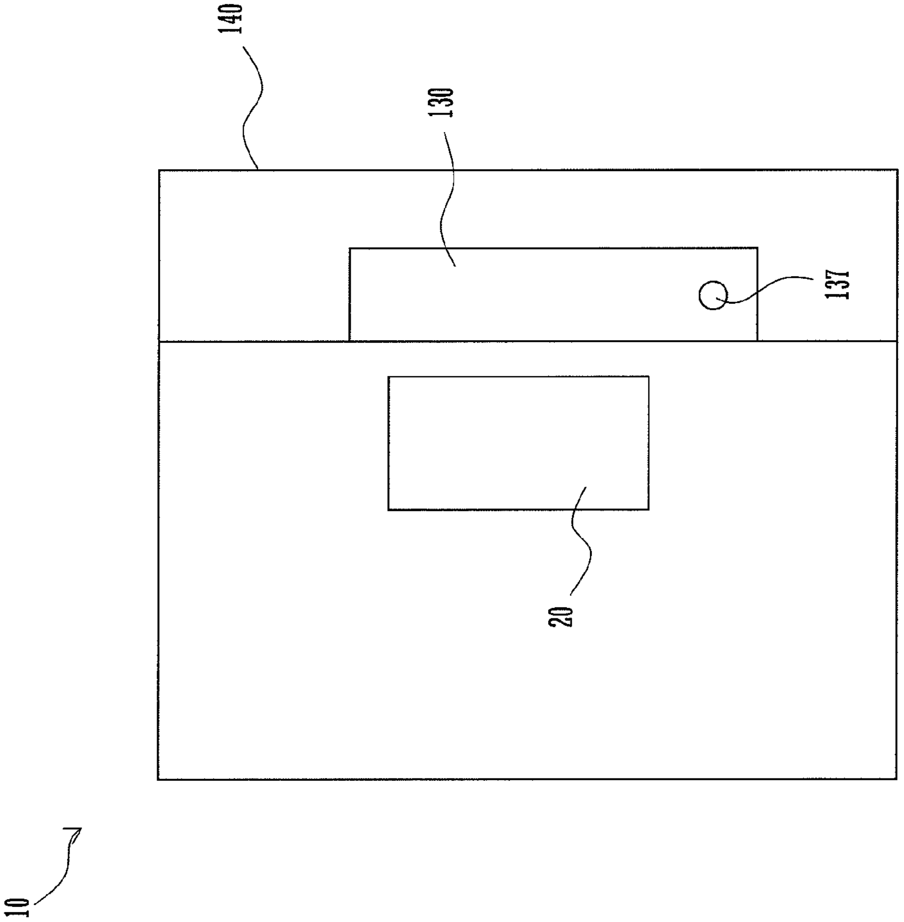
FIG. 7 is a right-hand side elevational view illustrating a relevant portion of an image forming apparatus according to a second embodiment of the present invention.

FIG. 7 is a right-hand side elevational view illustrating a relevant portion of image forming apparatus 10 according to a second embodiment of the present invention.

In the present embodiment, a pivoting axis 137 is defined to extend along a lower edge of the pivotable support member 130 which forms one side (i.e., one horizontally extending side) of the pivotable support member 130 by non-illustrated hinges provided at a lower edge portion of the pivotable support member 130.

Figure 8:
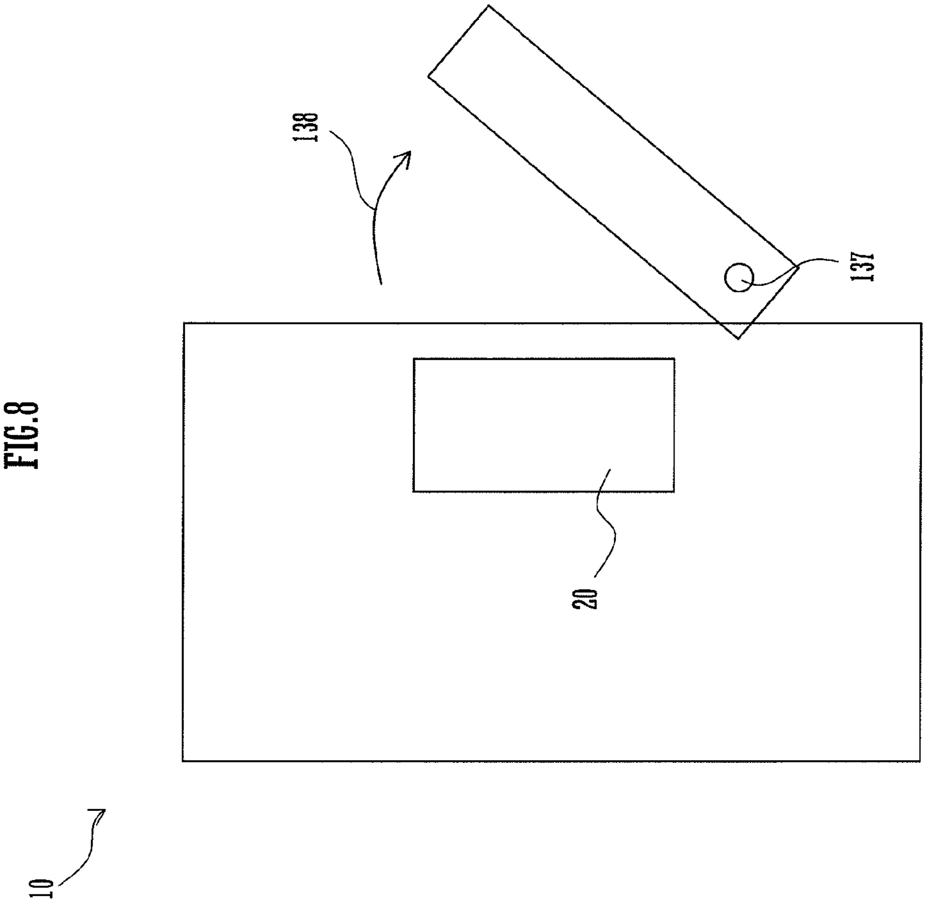
FIG. 8 is a right-hand side elevational view of the image forming apparatus for illustrating a pivoting direction of a pivotable support member.
Figure 9:
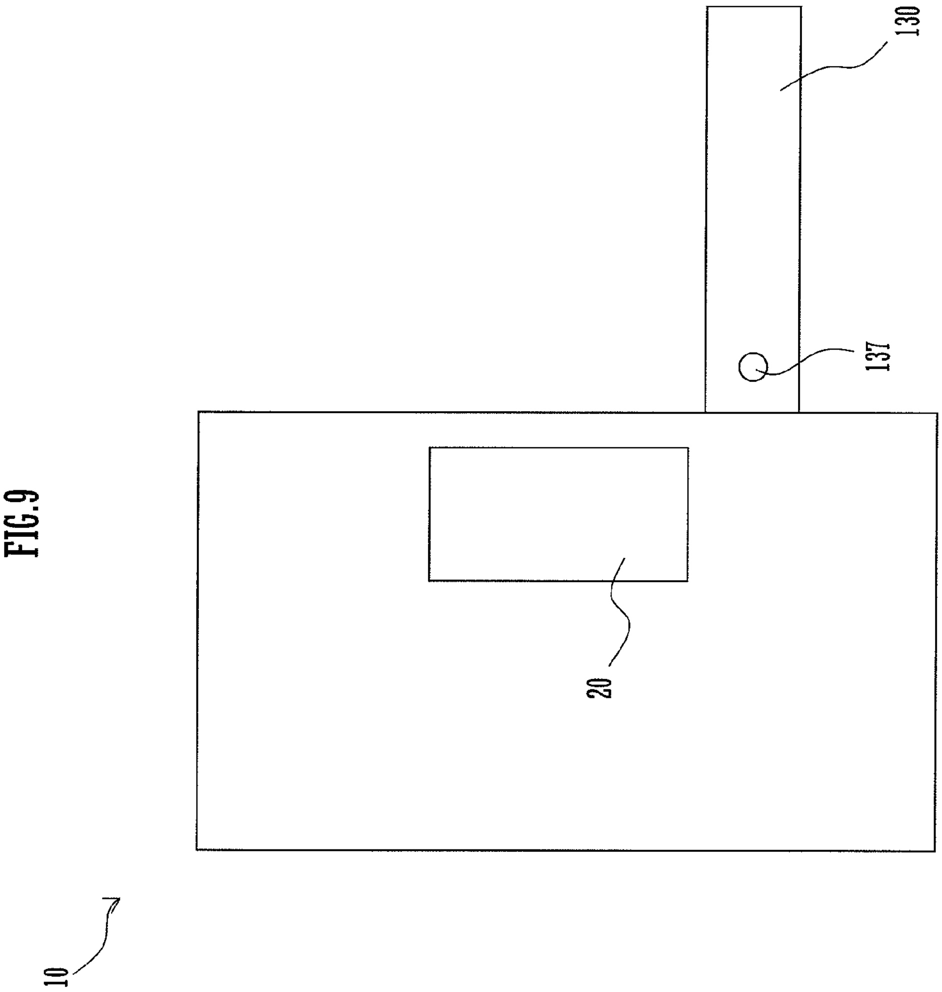
FIG. 9 is a right-hand side elevational view of the image forming apparatus for illustrating a state in which the pivotable support member is in an open position.

During maintenance, the pivotable support member 130 can pivotally move from the closed position shown in FIG. 7 in the direction indicated by arrow 138 of FIG. 8 to the open position shown in FIG. 9.

In this arrangement, the harness 150 passes through the pivoting axis 137 side of the pivotable support member 130 to connect the image forming unit 20 to the electric circuit board 120. Therefore, the harness 150 fails to become tense even when the pivotable support member 130 pivots from the closed position to the open position. Therefore, there is no need to draw out the harness 150 by an extra length in routing the harness 150, which enables the total length of the harness 150 to be shortened.

Further, the pivotable support member 130 is shaped rectangular having the vertical length 131 that is shorter than the horizontal length 132 and is pivotable about the pivoting axis 137 defined to extend along one horizontally extending side of the pivotable support member 130. For this reason, a relatively small space will suffice for the pivotable support member 130 to pivot from the closed position to the open position. Therefore, the pivotable support member 130 can fully pivot to reach the open position during maintenance on the electronic apparatus 10, thereby enabling the operability to be improved in performing maintenance on the electronic apparatus 10.

Figure 10:
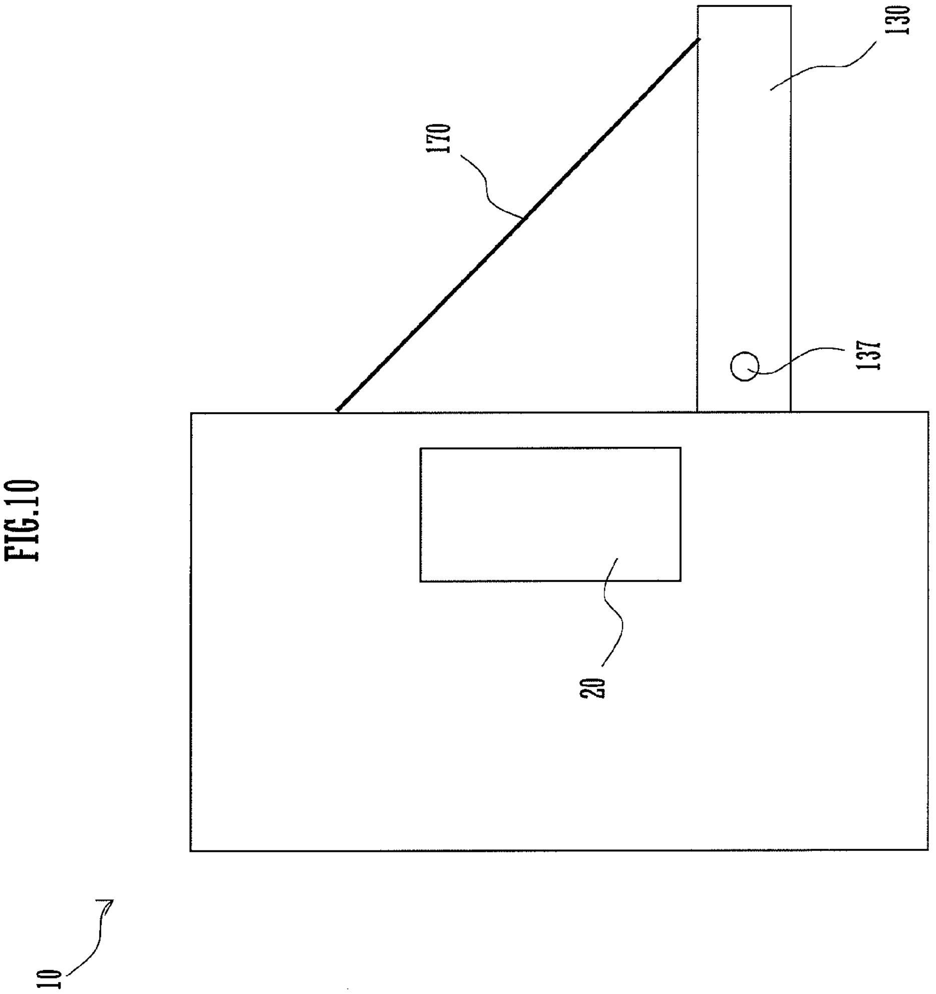
FIG. 10 is a right-hand side elevational view of the image forming apparatus for illustrating a stay retaining the pivotable support member in the open position.

Preferably, the image forming apparatus 10 further includes a stay 170 as shown in FIG. 10. The stay 170 is equivalent to the "second retaining member" defined by the present invention. The stay 170 retains the pivotable support member 130 in the open position.

With this feature, the pivotable support member 130 is reliably retained in the open position by the stay 170 after having been pivotally moved into the open position. This provides improved accessibility to the image forming unit 20 disposed more inwardly than the pivotable support member 130, thereby allowing maintenance to be performed safely.

Further, the electric circuit board 120 supported by the pivotable support member 130 can be prevented from touching the ground or the like.

Figure 11:
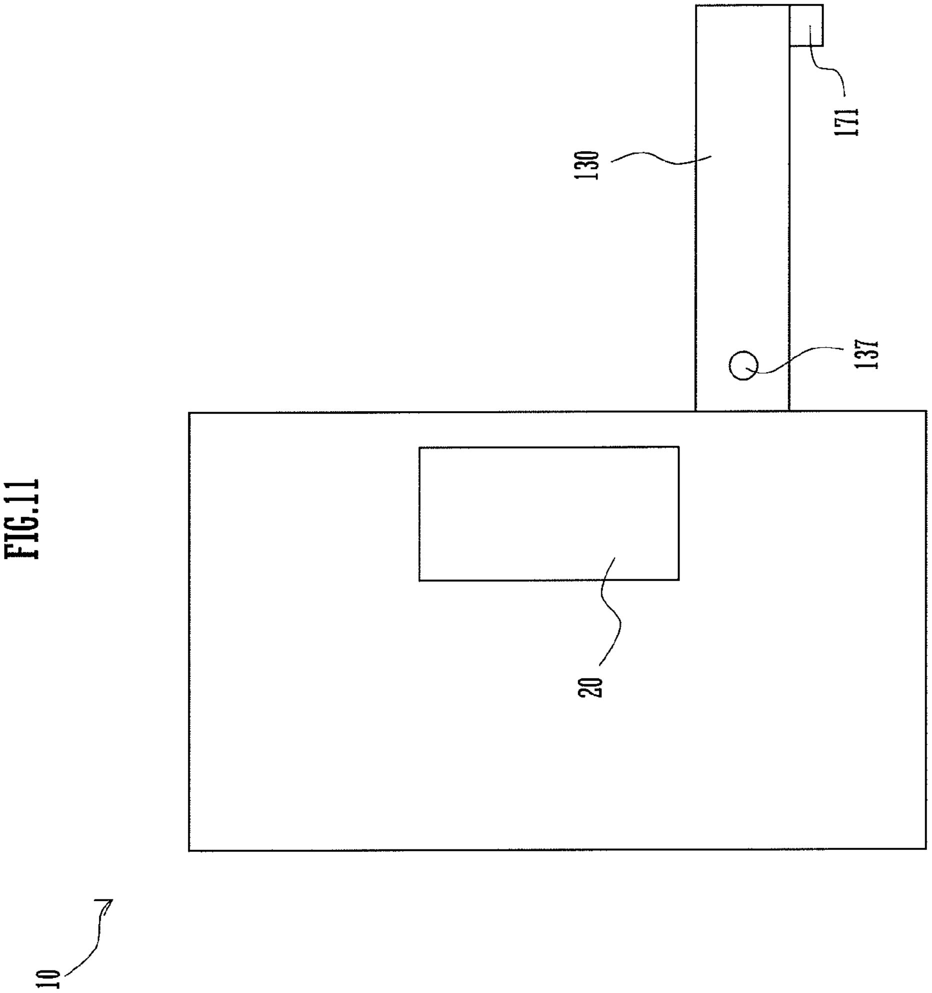
FIG. 11 is a view illustrating a variation of the image forming apparatus shown in FIG. 10.

Instead of the stay 170, a projection 171 may be provided as shown in FIG. 11. This feature can exercise the same effect as with the stay 170.

The foregoing embodiments should be construed to be illustrative and not limitative of the present invention in all the points. The scope of the present invention is defined by the following claims, not by the foregoing embodiments. Further, the scope of the present invention is intended to include the scopes of the claims and all possible changes and modifications within the senses and scopes of equivalents.

What is claimed is:

1. An electronic apparatus comprising:

a functional unit disposed inside the electronic apparatus and having a driving portion;

an electric circuit board configured to control the functional unit;

a pivotable support member being rectangular in shape disposed more outwardly than the functional unit to support the electric circuit board, the pivotable support member being pivotally movable about a pivoting axis defined to extend along one horizontally extending side of the pivotable support member between a closed position in which the pivotable support member covers the functional unit and an open position in which the functional unit is exposed; and wiring passing through the one horizontally extending side of the pivotable support member to connect the functional unit to the electric circuit board.

2. The electronic apparatus according to claim 1, further comprising:

a first retaining member which retains the pivotable support member in the open position, wherein the horizontally extending side is a side which forms an upper edge of the pivotable support member.

3. The electronic apparatus according to claim 1, further comprising:

a retaining member which retains the pivotable support member in the open position, wherein the horizontally extending side is a side which forms a lower edge of the pivotable support member.

4. The electronic apparatus according to claim 1, wherein the functional unit includes an image forming unit.

5. The electronic apparatus according to claim 1, further comprising:

an outer cover disposed more outwardly than the pivotable support member.

6. The electronic apparatus according to claim 1, wherein the pivotable support member has a vertical length shorter than a horizontal length thereof.

* * * * *